United States Patent
Gomez-Iglesias et al.

(10) Patent No.: US 12,100,782 B2
(45) Date of Patent: Sep. 24, 2024

(54) OPTOELECTRONIC SEMICONDUCTOR CHIP AND METHOD FOR PRODUCING AN OPTOELECTRONIC SEMICONDUCTOR CHIP

(71) Applicant: OSRAM Opto Semiconductors GmbH, Regensburg (DE)

(72) Inventors: Alvaro Gomez-Iglesias, Regensburg (DE); Asako Hirai, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 387 days.

(21) Appl. No.: 17/435,612

(22) PCT Filed: Mar. 3, 2020

(86) PCT No.: PCT/EP2020/055574
§ 371 (c)(1),
(2) Date: Sep. 1, 2021

(87) PCT Pub. No.: WO2020/182545
PCT Pub. Date: Sep. 17, 2020

(65) Prior Publication Data
US 2022/0131034 A1  Apr. 28, 2022

(30) Foreign Application Priority Data
Mar. 13, 2019 (DE) .......................... 102019106419.8

(51) Int. Cl.
*H01L 33/14* (2010.01)
*H01L 31/0352* (2006.01)
(Continued)

(52) U.S. Cl.
CPC ...... *H01L 33/14* (2013.01); *H01L 31/035236* (2013.01); *H01L 31/03529* (2013.01);
(Continued)

(58) Field of Classification Search
None
See application file for complete search history.

(56) References Cited

U.S. PATENT DOCUMENTS

| 8,878,225 B2 | 11/2014 | Ingle et al. |
| 9,048,383 B2 | 6/2015 | Mayer et al. |

(Continued)

FOREIGN PATENT DOCUMENTS

| CN | 102834918 A | 12/2012 |
| CN | 103779466 A | 5/2014 |

(Continued)

*Primary Examiner* — Bilkis Jahan
(74) *Attorney, Agent, or Firm* — Slater Matsil, LLP

(57) ABSTRACT

In an embodiment an optoelectronic semiconductor chip includes a semiconductor layer sequence with a first layer, a second layer and an active layer arranged between the first layer and the second layer, the semiconductor layer sequence having at least one injection region, wherein the first layer includes a first conductivity type, wherein the second layer includes a second conductivity type, wherein the semiconductor layer sequence includes the first conductivity type within the entire injection region, wherein the injection region, starting from the first layer, at least partially penetrates the active layer, wherein side surfaces of the semiconductor layer sequence are formed at least in places by the injection region, and wherein the injection region is configured to inject charge carriers directly into the active layer.

19 Claims, 6 Drawing Sheets

(51) Int. Cl.
*H01L 31/18* (2006.01)
*H01L 33/00* (2010.01)
*H01L 33/06* (2010.01)

(52) U.S. Cl.
CPC ...... *H01L 31/1848* (2013.01); *H01L 31/1852* (2013.01); *H01L 33/007* (2013.01); *H01L 33/06* (2013.01)

(56) References Cited

U.S. PATENT DOCUMENTS

| | | |
|---|---|---|
| 9,190,571 B2 | 11/2015 | Choi et al. |
| 10,862,003 B2 | 12/2020 | Lehnhardt et al. |
| 2010/0020837 A1* | 1/2010 | Gan ................. H01L 33/145 |
| | | 372/45.013 |
| 2011/0001121 A1* | 1/2011 | Ahn ................... H01L 33/06 |
| | | 257/14 |
| 2017/0200861 A1 | 7/2017 | Pfeuffer et al. |
| 2018/0062029 A1* | 3/2018 | Gomez-Iglesias .... H01L 33/025 |
| 2018/0331251 A1 | 11/2018 | Scholz et al. |
| 2018/0374991 A1 | 12/2018 | Bour et al. |
| 2020/0052153 A1 | 2/2020 | Gomez-Iglesias et al. |
| 2022/0131034 A1 | 4/2022 | Gomez-Iglesias et al. |

FOREIGN PATENT DOCUMENTS

| | | |
|---|---|---|
| DE | 102010026518 A1 | 1/2012 |
| DE | 102015104665 A1 | 9/2016 |
| DE | 102016208717 A1 | 11/2017 |
| WO | 2016151112 A1 | 9/2016 |
| WO | 2020182545 A1 | 9/2020 |

* cited by examiner

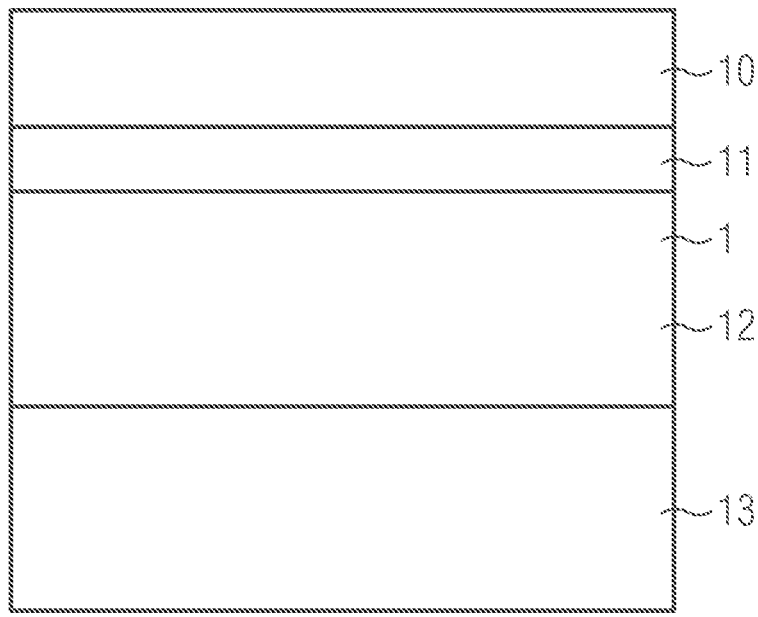
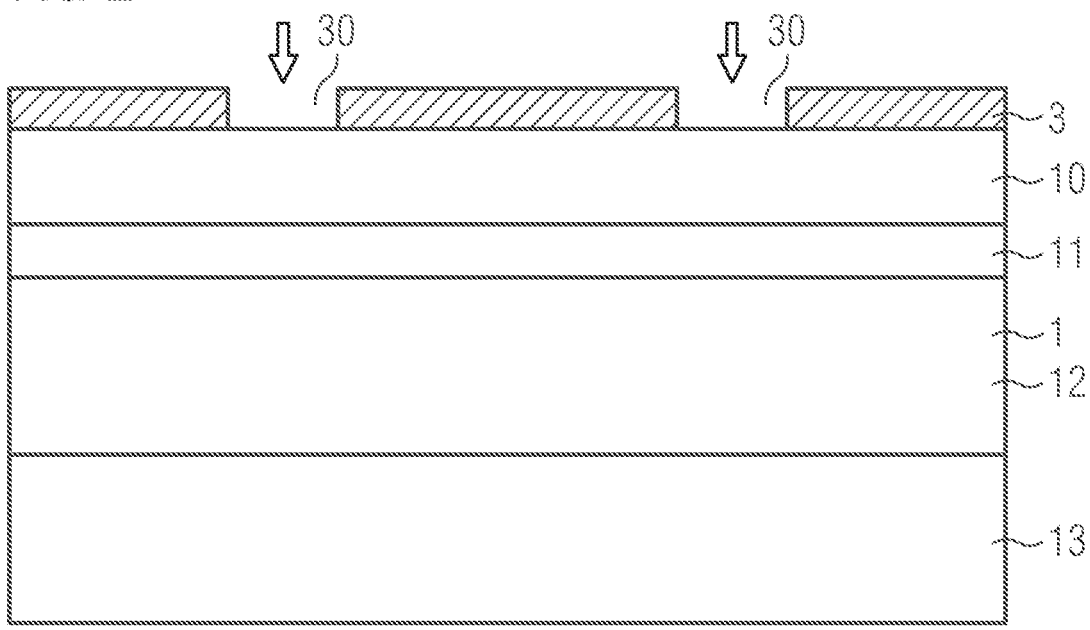

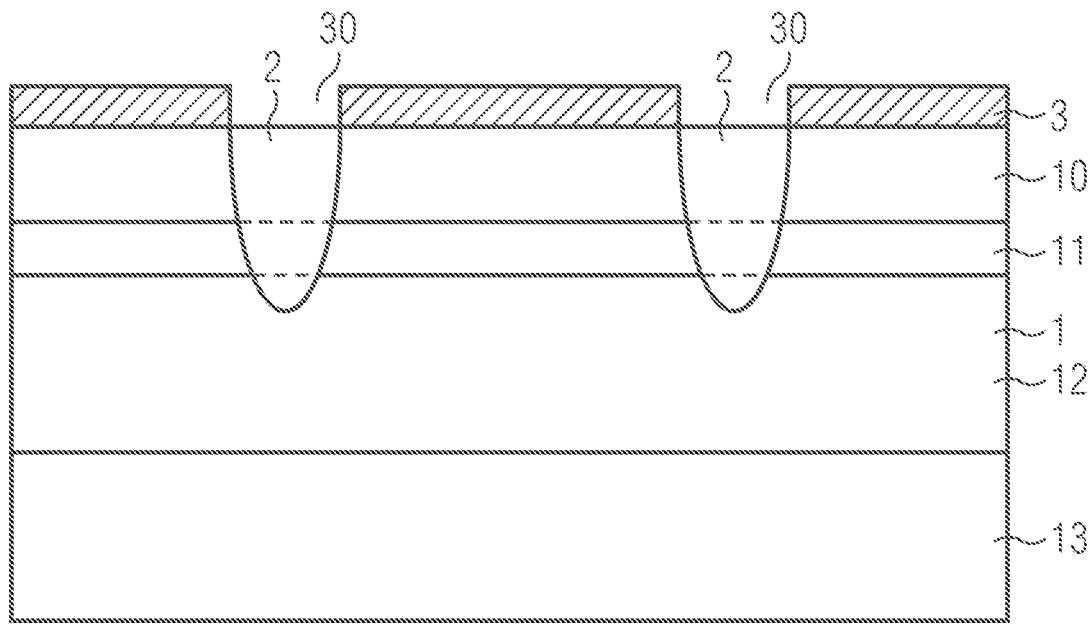
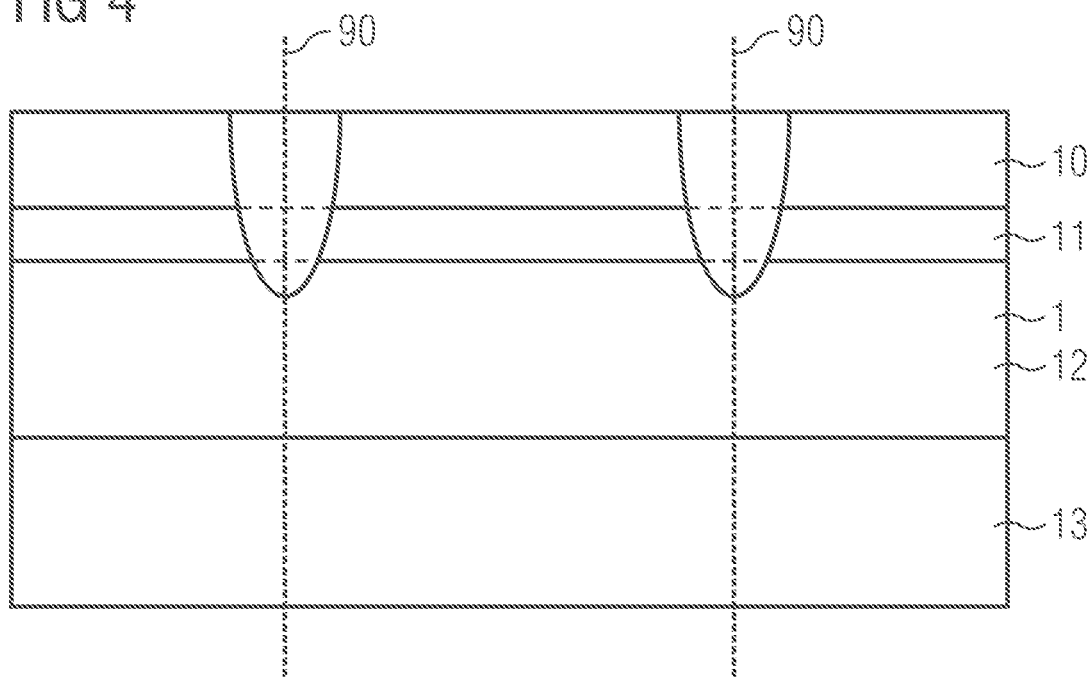

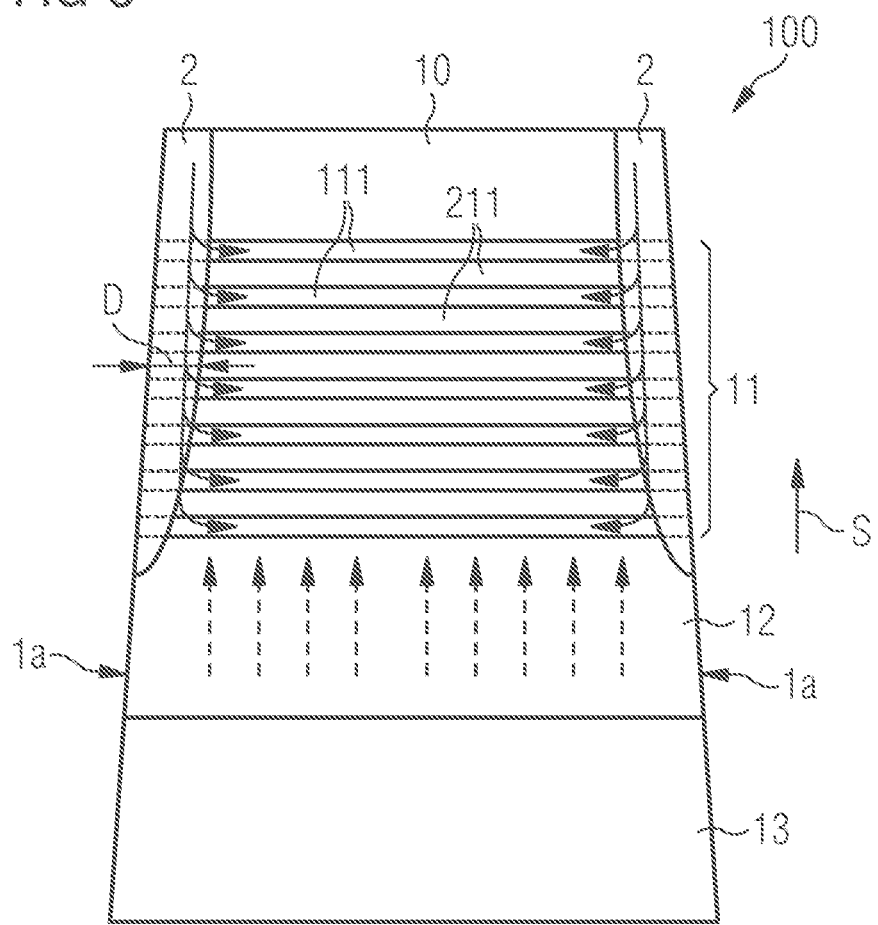

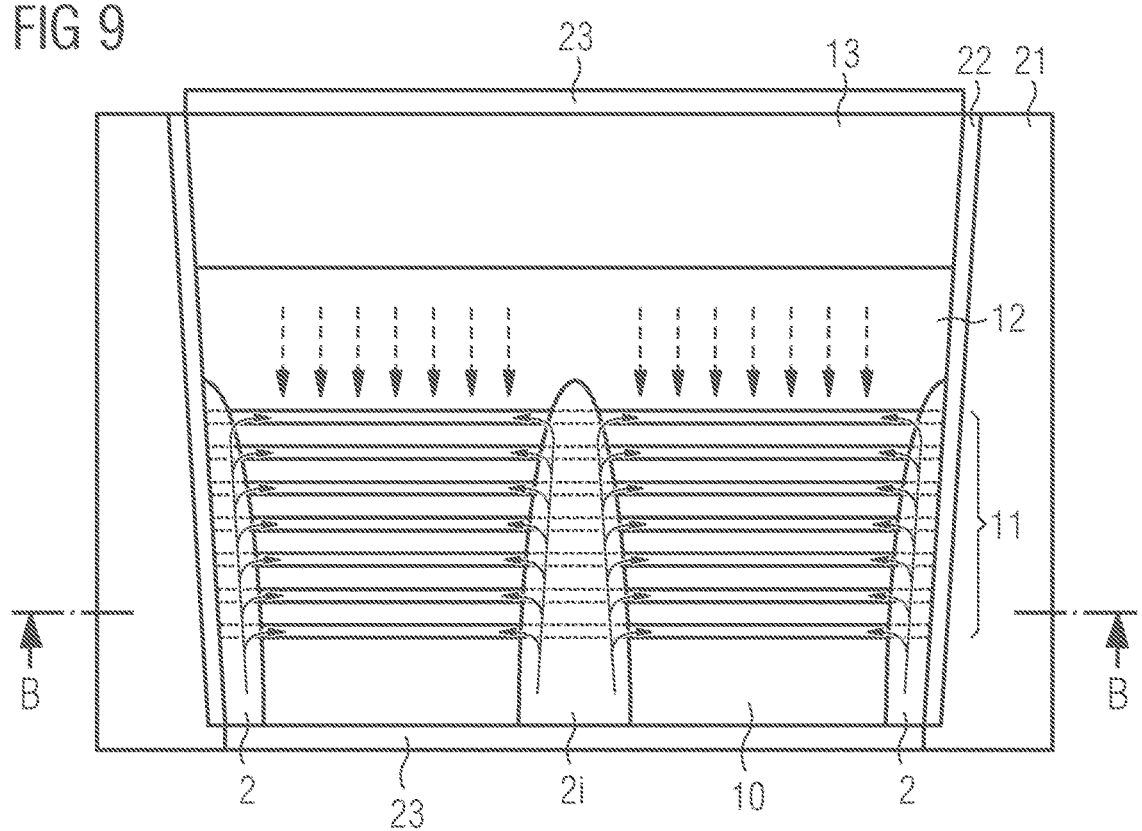
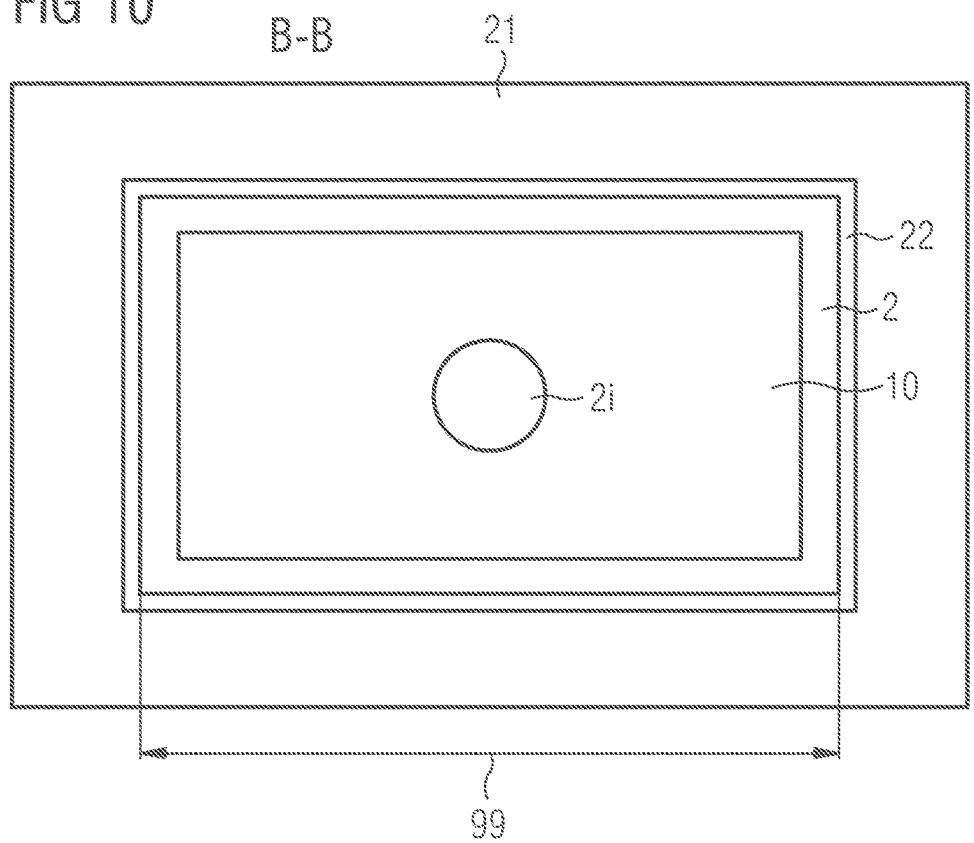

OPTOELECTRONIC SEMICONDUCTOR CHIP AND METHOD FOR PRODUCING AN OPTOELECTRONIC SEMICONDUCTOR CHIP

This patent application is a national phase filing under section 371 of PCT/EF2020/055574, filed Mar. 3, 2020, which claims the priority of German patent application 102019106419.8, filed Mar. 13, 2019, each of which is incorporated herein by reference in its entirety.

TECHNICAL FIELD

An optoelectronic semiconductor chip is specified. Furthermore, a method for producing an optoelectronic semiconductor chip is specified.

SUMMARY

Embodiments provide an optoelectronic semiconductor chip in which injection of charge carriers into the active layer is particularly effective. Further embodiments provide a method for producing such an optoelectronic semiconductor chip.

According to at least one embodiment, the optoelectronic semiconductor chip comprises a semiconductor layer sequence with a first layer, a second layer and an active layer arranged between the first layer and the second layer. The active layer is configured to emit or absorb electromagnetic radiation during intended operation and then to convert it, for example, into an electronic or optical signal. The first layer comprises a first conductivity type and the second layer comprises a second conductivity type. For example, the first conductivity type may be a p-type conductivity of a p-doped layer that comprises holes as charge carriers. The second conductivity type may be an n-type conductivity of an n-doped layer comprising electrons as charge carriers. Alternatively, the two layers may be the other way round or equally doped, for example n- or p-doped. The conductivity type here and in the following refers to the majority charge carriers, i.e. electrons in n-doped layers and holes in p-doped layers.

In this context, the first and/or second layer may in particular also refer in each case to a layer sequence comprising a plurality of individual layers. For example, the first layer comprises all semiconductor layers between a first main side of the semiconductor layer sequence and the active layer. The second layer may, for example, comprise all layers between a second main side of the semiconductor layer sequence opposite the first main side and the active layer.

The semiconductor layer sequence is based on, for example, a III/V compound semiconductor material. The semiconductor material is for example a nitride compound semiconductor material, in particular all layers of the semiconductor layer sequence are based on a nitride compound semiconductor material, such as $Al_nIn_{1-n-m}Ga_mN$, or a phosphide compound semiconductor material, such as $Al_nIn_{1-n-m}Ga_mP$, or also an arsenide compound semiconductor material, such as $Al_nIn_{1-n-m}Ga_mAs$ or $Al_nIn_{1-n-m}Ga_mAsP$, wherein $0 \leq n \leq 1$, $0 \leq m \leq 1$ and $m+n \leq 1$, respectively. The semiconductor layer sequence may comprise dopants as well as additional components. For simplicity, however, only the essential constituents of the crystal lattice of the semiconductor layer sequence, i.e. Al, As, Ga, In, N or P, are specified, even if these may be partially replaced and/or supplemented by small amounts of additional substances. Preferably, the semiconductor layer sequence is based on AlInGaN.

In particular, the active layer of the semiconductor layer sequence includes at least one pn junction and/or at least one quantum well structure. For example, the active layer comprises a quantum well structure based on AlGaInN. A radiation generated by the active layer in operation is in particular in the spectral range between 400 nm and 800 nm inclusive.

In particular, semiconductor layer sequence is applied to a carrier. The carrier may be applied to a side of the semiconductor layer sequence facing away from or towards the first layer. In particular, the carrier may be a growth substrate for the semiconductor layer sequence or an auxiliary carrier applied afterwards. In particular, the carrier serves to stabilize and mechanically support the semiconductor layer sequence. For example, the semiconductor chip is then adapted to be self-supporting as a surface emitter or volume emitter. It is possible, for example, that the semiconductor chip is a sapphire chip or a thin-film chip.

According to at least one embodiment, the semiconductor layer sequence within an injection region is doped such that in the entire injection region the semiconductor layer sequence comprises the first conductivity type. The injection region is thus a doped partial region of the semiconductor layer sequence, for example a p-doped region if the first layer is also p-doped. In particular, the first layer as well as the injection regions are p-doped and comprise holes as the first conductivity type.

According to at least one embodiment, the injection region, starting from the first layer, at least partially penetrates the active layer.

According to at least one embodiment, side surfaces of the semiconductor layer sequence are formed at least in places by the injection region. The side surfaces extend transversely to a main extension plane of the semiconductor layer sequence. For example, the side surfaces have been formed during the separation of a semiconductor chip produced in a compound process. The side surfaces may be outwardly exposed surfaces of the semiconductor layer sequence. In particular, all side surfaces of the semiconductor layer sequence are formed at least partially with the material of the injection region. For example, the side surfaces of the semiconductor layer sequence are formed exclusively with the material of the injection region and the material of the second layer.

According to at least one embodiment, during operation of the semiconductor chip, charge carriers at least partially enter the injection regions from the first layer and the injection region is provided to inject charge carriers directly into the active layer. Thus, the injection regions and the active layer adjacent thereto are in direct electrical contact with each other and are not spaced apart and electrically isolated from each other by any other layers, such as insulation layers.

In at least one embodiment, the optoelectronic semiconductor chip comprises a semiconductor layer sequence with a first layer, a second layer, and an active layer arranged between the first layer and the second layer that absorbs or emits electromagnetic radiation during intended operation. The first layer comprises a first conductivity type and the second layer comprises a second conductivity type. An injection region is provided in the semiconductor chip, wherein the semiconductor layer sequence within the injection region is doped such that within the entire injection region the semiconductor layer sequence comprises the first conductivity type. Thereby, starting from the first layer, the injection region penetrates the active layer at least partially. Furthermore, side surfaces of the semiconductor layer sequence are formed at least in places by the injection region. During operation of the semiconductor chip, charge carriers at least partially pass from the first layer into the injection region, and the injection region is configured to inject charge carriers directly into the active layer.

The semiconductor chip described herein is based inter alia on the cognizance that the internal quantum efficiency, in particular of nitride-based LEDs, is limited by the mobility of holes in the active layer. The mobility of holes is often limited by, inter alia, the barrier height between quantum wells and barrier layers within the active layer. However, the occurrence of polarization charges also inhibits the mobility of holes.

In the semiconductor chip described here, use is made inter alia of the idea of at least partially doping the active region in the region of the side surface of the semiconductor layer sequence, thus forming injection regions. In this way, charge carriers, especially holes, can be pass from the first layer into the injection region during operation and can be effectively injected from there into the active layer, in particular over the entire thickness of the active layer. When using a multi-quantum well structure, this enables charge carriers to be injected preferentially uniformly into all quantum wells.

In addition, forming the side surfaces of the semiconductor layer sequence at least in places by the injection region enables charge carriers of one charge carrier type, i.e. either holes or electrons, to move predominantly close to the side surface of the semiconductor layer sequence. Advantageously, this reduces non-radiative recombination of charge carriers due to parasitic surface effects, which can occur increasingly at the side surfaces. This increases the efficiency of the entire semiconductor chip.

According to at least one embodiment, the semiconductor layer sequence in the active layer comprises a lower dopant concentration than in the injection region. In particular, the semiconductor layer sequence in the active layer has a lower or opposite doping concentration than in the injection region. Thus, the injection region is bounded or defined in the lateral direction by a transition from a doped region to a less or oppositely doped region.

Preferably, each injection region differs from the rest of the semiconductor layer sequence adjacent to the injection region, in particular from the adjacent active layer, only by the dopant concentration or the doping type. The material composition of the semiconductor layer sequence and the injection regions are then identical, for example, except for the concentration of the dopant.

According to at least one embodiment, each injection region comprises a dopant concentration of at least 1018 or at least 1019 or at least 1020 or at least 1021 dopant atoms per cm3 and the dopant concentration inside the active layer outside the injection region is at most one tenth, preferably at most one hundredth or opposite than in the injection region. Such a dopant concentration is preferably present within the entire injection region. In GaN-based semiconductor materials, for example, the active layer is slightly n-doped, and the injection region is then preferably p-doped.

According to at least one embodiment, at least 50% of the side surfaces of the semiconductor layer sequence are formed by the injection region. In particular, at least 70%, preferably at least 90% of the side surfaces of the semiconductor layer sequence are formed by the injection region.

According to at least one embodiment, the side surfaces of the semiconductor layer sequence are formed by a plurality of non-contiguous injection regions. For example, the semiconductor chip comprises a plurality of injection regions, each forming different side surfaces of the semiconductor layer sequence. In particular, the semiconductor chip comprises one injection region per side surface of the semiconductor layer sequence.

According to at least one embodiment, the active layer comprises a quantum well structure with at least one or more quantum well layers. At least one barrier layer is then arranged between two quantum well layers adjacent in a stack direction, for example. The band gaps between the valence band and the conduction band are smaller in the region of the quantum well layer than in the region of the barrier layer and the injection region. The width of the quantum well layer and the band gap occurring in the quantum well layer can be used to adjust the wavelength of the radiation emitted as a result of recombination within the quantum well layer. The main directions of extension of the barrier layers and the quantum well layers are substantially parallel to the main direction of extension of the active layer. The width is measured perpendicular to the main extension direction.

The presence of the injection region within the quantum well structure enables, for example, in operation, the injection of charge carriers from the first layer to be uniformly distributed to all quantum well layers, thereby increasing the quantum efficiency of the device compared to devices without injection regions.

According to at least one embodiment, the barrier layer comprises a thickness of at least 1 nm, preferably at least 3 nm, particularly preferably at least 6 nm, along the stack direction of the semiconductor layer stack. In particular, the barrier layer is configured to compensate for tensions between different layers of the semiconductor layer stack. A reduced tensioning of the layers enables a particularly high material quality of the layers of the semiconductor layer stack. Advantageously, the layers of the semiconductor layer stack comprise a low density of defects and a particularly homogeneous material composition within the individual layers.

According to at least one embodiment, the injection region tapers from the first layer towards the second layer, completely penetrates the active layer and projects at least partially into the second layer. Preferably, the injection regions project at least 50 nm or at least 100 nm or at least 150 nm into the second layer. Alternatively or additionally, the injection regions protrude at most 300 nm or at most 250 nm or at most 200 nm into the second layer.

According to at least one embodiment, the injection region tapers from the first layer towards the second layer, and comprises a thickness between 50 nm and 5 µm inclusive, preferably between 100 nm and 200 nm. Here, the thickness of the injection region is measured perpendicular to the side surface is from the side surface is to the active layer 11. For example, an area occupancy density of the injection region or all injection regions together along the entire active layer is at least 0.5% or at least 1% or at least 2%. Alternatively or additionally, the area occupancy density is at most 30% or at most 10% or at most 3%. By choosing such an area occupancy density, on the one hand an effective injection of the charge carriers into the active layer is enabled, on the other hand enough area of the active layer remains free of injection regions to guarantee a high light efficiency.

According to at least one embodiment, the dopant concentration is constant within each entire injection region. In this context, constant means that the dopant concentration varies by at most +/−5% around a mean dopant concentration in the injection region within the manufacturing tolerances. Alternatively, the dopant concentration within the injection region may continuously decrease from the side surface of the semiconductor layer sequence perpendicular to the side surface towards the interior of the semiconductor chip. A gradient of the dopant concentration perpendicular to a main extension direction of the active layer is also conceivable. For example, the dopant concentration then decreases in the direction away from the first layer within the injection region.

According to at least one embodiment, the semiconductor chip comprises an extension of at most 20 µm, preferably at most 10 µm, along the main extension direction of the active layer. In particular, the semiconductor chips comprise polygonal, in particular quadrangular, contours in plan view of their main extension plane. The edge length of the contour is a maximum of 20 µm, preferably a maximum of 10 µm. In the case of semiconductor chips with a particularly small extension, in particular with a particularly small edge length, the area ratio of side surfaces of the semiconductor layer sequence to the sum of outwardly exposed surfaces of the semiconductor layer sequence is particularly large. The side surfaces run transverse to the main extension plane of the active layer of the semiconductor layer sequence, which is why parasitic effects, which lead to non-radiative recombination of charge carriers, occur increasingly at the side surfaces. By means of the injection region, which at least partially forms the side surfaces of the semiconductor layer sequence, the non-radiative recombination at the side surfaces is reduced, since charge carriers of one type are predominantly guided in the injection region. Thus, especially for semiconductor chips with small dimensions, the efficiency is increased by means of the injection regions.

According to at least one embodiment, an indium concentration in the injection region alternates along the stack direction. In particular, the injection region is overlaid with the semiconductor layer sequence. That is, the semiconductor layer sequence is initially grown completely, and only after the growth are the injection regions introduced via a doping process. This results in particular in the fact that the geometrical layout especially of the active layer is not influenced by the position and the shape of the injection regions. The injection regions are thus doped subregions within the semiconductor layer sequence, which are superimposed with the semiconductor layer sequence. The material composition of the semiconductor layer sequence and the injection region can be identical, for example, except for the concentration of the dopant.

Alternatively, the injection region and active layer differ in their indium concentration. For example, the alternating barrier and quantum well layers comprise indium concentrations different from each other. This alternating indium concentration can be at least partially maintained in the injection region. Consequently, the injection region and the active layer comprise an indium concentration alternating along the stack direction, wherein the rate of change with which the indium concentration alternates differs in the injection region and in the active layer.

Due to the high doping level, the concentration of essential constituents of the crystal lattice may be altered within the injection region, compared to layers of the semiconductor layer sequence adjacent to the injection region in the lateral direction. In particular, the doping process and the increased dopant concentration in the injection region may cause migration or immigration of essential constituents of the crystal lattice, such as indium in an AlInGaN semiconductor layer sequence. This process is called intermixing. The maximum indium content within an injection region is then increased or reduced compared to the indium content of the adjacent layers of the semiconductor layer sequence, for example by at least 10% or 50%.

Since injection regions are produced after growth of the semiconductor layer sequence by means of doping, also on average the positions of the injection regions are uncorrelated to positions of any crystal defects within the semiconductor layer sequence. Such crystal defects can be present, for example, in the form of lattice dislocations. Lattice dislocations arise, for example, during the growth of the semiconductor layer sequence due to the lattice constant matching to the growth substrate. Preferably, these crystal perturbations or lattice dislocations are purely statistically distributed, i.e. they do not comprise a regular geometrical assembly within the semiconductor layer sequence.

For GaN-based semiconductor materials, the lattice dislocation density when grown on a sapphire substrate is typically $10^7$ to $10^9$ per $cm^2$, but when grown on a GaN substrate, the lattice dislocation density can be several orders of magnitude lower.

Especially in nitride-based semiconductor materials, V-shaped indentations, so-called V-pits or V-defects, appear in the active layer due to such lattice dislocations. Such indentations in the active layer typically have depths perpendicular to the main extension direction of the active layer of at least 30 nm or at least 100 nm.

Preferably, in the semiconductor chip described herein, these V-pits formed during growth of the semiconductor layer sequence have no correlation to injection regions. That is, the position of the V-pits is on average uncorrelated to the position of the injection regions.

In particular, the probability of a lattice dislocation of the semiconductor layer sequence, in particular a V-pit, to be found within an injection region is at most 50% or at most 10% or at most 1%.

For example, the active layer is continuously planar within at least 50% or at least 90% or at least 99% of the injection regions. In this context, continuously planar means that the active layer within the entire injection region does not comprise any steps or structures or indentations whose depth perpendicular to the main extension direction of the active layer is more than 10 nm or more than 20 nm. Alternatively or additionally, on average, at least 50% or 90% or 99% of the area of the active layer within each injection region is formed planar.

According to at least one embodiment, the semiconductor chip comprises an extension of at least 3 µm, preferably at least 20 µm, along the main extension direction of the active layer and comprises at least one additional injection region, wherein the additional injection region is laterally surrounded by a continuous path of the active layer.

In cross-sectional view when cut along the active layer, the additional injection region may comprise, for example, circular, oval, hexagonal, or rectangular cross-sectional shapes. In this view, the additional injection region is preferably completely surrounded by the active layer without interruption.

Furthermore, a method for producing an optoelectronic semiconductor chip is specified. The method is particularly suitable for producing an optoelectronic semiconductor chip described herein. That is, all features disclosed in connection with the optoelectronic semiconductor chip are also disclosed for the method, and vice versa.

According to at least one embodiment, the method for producing an optoelectronic semiconductor chip comprises a step A in which a semiconductor layer sequence of a first layer of a first conductivity type, a second layer of a second conductivity type, and an active layer arranged between the first layer and the second layer is provided, wherein electromagnetic radiation is absorbed or emitted by the active layer during intended operation.

In a subsequent step B, the semiconductor layer sequence is then selectively doped in at least one laterally defined and laterally limited injection region. In step B, doping is performed in such a way that within the entire injection region the semiconductor layer sequence comprises the same conductivity type as the first layer. Preferably, the injection region thus created, starting from the first layer, at least partially penetrates the active layer. After doping in step B, the active layer is less or oppositely doped than in the injection region.

According to at least one embodiment, the method for producing an optoelectronic semiconductor chip comprises a step C, in which the semiconductor layer sequence is separated into at least one semiconductor chip by means of cutting through the semiconductor layer sequence along imaginary cutting lines. In this process, the cutting lines run at least partially through the injection region and, after the separation, side surfaces of the semiconductor layer sequence are formed at least in places by the injection region. In particular, the side surfaces of the semiconductor layer sequence are formed by the singulation.

According to at least one embodiment, after method step B) and before method step C), the injection region forms a regular grid or a plurality of injection regions are arranged along grid lines of a regular grid. In particular, the injection regions are distributed in a matrix-like or hexagonal manner along the active layer. Thus, the assembly of the injection regions along the active layer is preferably not random, but follows a pattern and is periodic or regular.

According to at least one embodiment, a mask is applied to the side of the first layer facing away from the active layer prior to step B). The mask thereby preferably comprises at least one opening in which the semiconductor layer sequence is exposed. Doping is performed by an ion implantation process in the region of the opening, wherein the mask is used to laterally define and laterally limit the doping.

Regions of the semiconductor layer sequence outside the opening are covered by the mask. In the ion implantation process, doping atoms are shot onto the mask from a side of the mask facing away from the active layer. Doping of the semiconductor layer sequence then occurs in the region of the opening, preferably exclusively in the region of the opening. The doping below the mask is preferably suppressed by the mask, in particular completely suppressed.

For the production of the mask, a mask layer can first be applied to the semiconductor layer sequence. Subsequently, the mask is patterned, for example, by means of a lithography method, such as a stepper method or a nanoprecipitated lithography method, and the at least one opening is created in the mask layer in the process.

For example, the mask comprises or consists of a metal, such as gold, silver, aluminum, titanium, or steel. It is also conceivable that the mask is formed of or comprises a photoresist.

After the ion implantation process for doping the injection region, the semiconductor layer sequence may be subjected to a thermal annealing process. During this healing process, some imperfections or lattice defects generated by the ion implantation process may recede or heal, respectively. This in turn can increase the visual efficiency of the semiconductor chip. For the healing process, the semiconductor layer sequence is heated, for example, to a temperature of at least 1000° C.

According to at least one embodiment, the semiconductor layer sequence is grown on a growth substrate before step A, wherein first the second layer, then the active layer, and then the first layer is grown. This is followed by doping of the semiconductor layer sequence in step B from a side facing away from the growth substrate, for example by means of ion implantation. After step B, an auxiliary carrier is then applied to the side of the semiconductor layer sequence facing away from the growth substrate, for example, and the growth substrate is detached. In this way, for example, a thin film semiconductor chip may be produced with the above-mentioned injection regions. Alternatively, however, the growth substrate can remain in the semiconductor chip and an auxiliary carrier can be omitted. In this way, for example, a volume semiconductor chip such as a sapphire chip could be produced. The growth substrate can be, for example, a silicon or GaAs or GaN or SiC or sapphire growth substrate.

BRIEF DESCRIPTION OF THE DRAWINGS

In the following, an optoelectronic semiconductor chip described here and a method for producing an optoelectronic semiconductor chip are explained in more detail with reference to drawings based on exemplary embodiments. Identical reference signs specify identical elements in the individual figures. However, no references to scale are shown; rather, individual elements may be shown in exaggerated size for better understanding.

In the Figures:

FIGS. 1, 2, 3 and 4 show exemplary embodiments of method steps for manufacturing an optoelectronic semiconductor chip in sectional view;

FIGS. 5, 7 and 9 show exemplary embodiments of an optoelectronic semiconductor chip in sectional view;

FIGS. 8 and 10 show exemplary embodiments of an optoelectronic semiconductor chip in plan view.

DETAILED DESCRIPTION OF ILLUSTRATIVE EMBODIMENTS

Figure 6A:
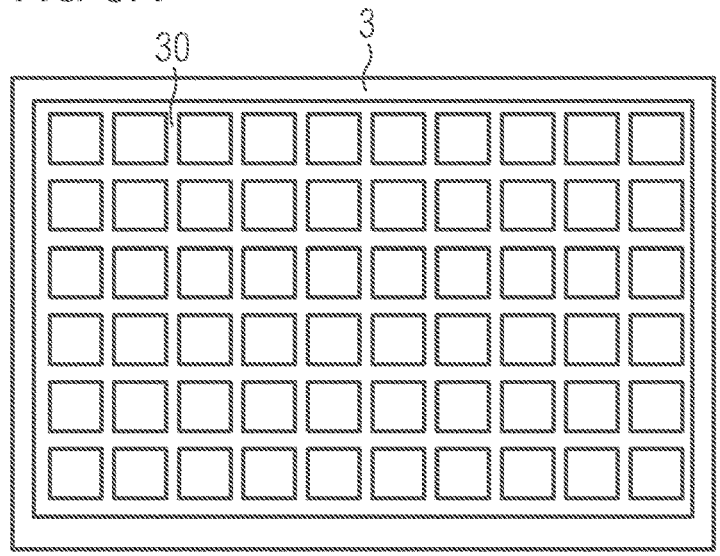
FIGS. 6A, 6B, and 6C show exemplary embodiments of masks for fabricating optoelectronic semiconductor chips in plan view.

In the exemplary embodiments of FIGS. 1 to 4, various method steps of a method for producing an optoelectronic semiconductor chip 100 described here by way of example are shown. In each case, the semiconductor chip wo is viewed in sectional view.

FIG. 1 shows sectional view through a semiconductor layer sequence 1, which is provided in a method step A). The semiconductor layer sequence 1 is arranged on a carrier 13. The semiconductor layer sequence 1 may be grown, for example, on a main side of the carrier 13. The carrier 13 is, for example, the growth substrate for the semiconductor layer sequence 1. The carrier 13 is, for example, a sapphire carrier, and the semiconductor layer sequence 1 is based on AlInGaN, for example.

The semiconductor layer sequence 1 comprises a first layer 10, made of a material of a first conductivity type, an active layer 11 and a second layer 12, made of a material of a second conductivity type, wherein the active layer 11 is arranged between the first layer 10 and the second layer 12 and the second layer 12 faces the carrier 13. Here, the first layer 10 is, for example, p-doped, and the second layer 12 is, for example, n-doped. The active layer 11 can be undoped or, for example, slightly n-doped.

The first layer 10 comprises a thickness perpendicular to a main extension direction of the semiconductor layer sequence of at most 1 µm, preferably at most 0.5 µm. The thickness of the second layer 12 is preferably between 3 µm and 6 µm inclusive. The thickness of the active layer 11 is, for example, between 50 nm and 200 nm inclusive and may comprise, for example, two to ten quantum well layers 111.

In FIG. 2, a semiconductor layer sequence 1 is provided on a carrier 13. The sequence of the individual layers of the semiconductor layer sequence 1 corresponds to the sequence in FIG. 1. A mask 3, for example made of a metal such as aluminum or silver or gold, is further applied to a side of the first layer 10 facing away from the carrier 13. The mask 3 further comprises openings 30 in which the side of the semiconductor layer sequence 1 facing away from the carrier 13 is exposed. The rest of the semiconductor layer sequence 1 is covered with the mask 3.

Furthermore, the arrows in FIG. 3A illustrate the start of an ion implantation process in which, for example, ionized magnesium atoms are shot onto a side of the mask 3 facing away from the carrier 13. In the region of the openings 30, a laterally defined and laterally limited injection region 2 is formed in a method step B) by doping the semiconductor layer sequence 1.

In FIG. 3, a method step is shown after the doping process has been completed. In particular, in this exemplary embodiment, the doping has been performed by means of an ion-implosion process. The doping process has created an injection region 2 in the region of the openings 30, in which the semiconductor layer sequence 1 is doped. Below the mask 3 in regions outside the opening 30, no dopant concentration or a lower dopant concentration of the semiconductor layer sequence 1 has occurred. Thus, the mask 3 has shielded or intercepted the ions from the ion implantation process. The semiconductor layer sequence 1 has been doped such that within the entire injection region 2, the semiconductor layer sequence 1 comprises the same conductivity type as the first layer 10, the injection region 2 starting from the first layer 10 penetrates the active layer 11 at least partially, and the active layer 11 is doped less or in the opposite way than in the injection region 2.

In the entire injection region 2, a dopant concentration of at least 1018 dopant atoms per cm3 is present. In the active layer 11, the semiconductor layer sequence 1 comprises a lower dopant concentration than in the injection region 2. The dopant concentration in the active layer 11 outside the injection region 2 is at least one order of magnitude, preferably at least two orders of magnitude, lower or opposite than in the injection region 2. In the injection region 2, the indium concentration alternates along a stack direction S.

FIG. 4 shows the same exemplary embodiment as in FIG. 3, except that the mask 3 has been removed after the doping process. The semiconductor layer sequence is separated in a method step C) to form at least one semiconductor chip 100. In this process, the semiconductor layer sequence 1 is singulated along imaginary cutting lines 90, wherein the cutting lines 90 extend at least partially through the injection region 2, and after singulation side surfaces 1a of the semiconductor layer sequence 1 are formed at least in places by the injection region 2.

In particular, the method steps A), B) and C) shown in FIGS. 1 to 4 are carried out in the order indicated.

In FIG. 5, an exemplary embodiment of the semiconductor chip 100 is shown in sectional view. Such a semiconductor chip 100 may be represented, for example, by means of method steps A), B) and C), which are outlined in connection with FIGS. 1 to 4.

The semiconductor chip 100 comprises an active layer 11 formed of a quantum well structure with a plurality of quantum well layers iii and barrier layers 211 stacked alternately on top of each other in a stack direction S. In this case, the active layer 11 comprises, for example, a thickness between 50 nm and 200 nm, inclusive. The quantum well layers iii each have, for example, a thickness between 2 nm and 10 nm, inclusive. The barrier layers have a thickness of at least 1 nm along the stack direction S of the semiconductor layer stack 1, preferably at least 3 nm, particularly preferably at least 6 nm. The quantum well structure of FIG. 2 is based, for example, on AlInGaN and comprises between 10 and 20 quantum well layers iii. The band gaps within the quantum well layers 111 are preferably smaller than within the barrier layers 211.

The injection region 2 tapers from the first layer 10 towards the second layer 12. The injection region 2 completely penetrates the active layer 11 and projects into the second layer 12. The injection region 2 projects at least 50 nm and at most 300 nm into the second layer 12. The injection region 2 comprises a thickness D between 50 nm and 5 µm inclusive, preferably between 100 nm and 300 nm, wherein the thickness D of the injection region 2 is measured perpendicular to the side surface is up to the active layer 11.

Furthermore, FIG. 5 schematically shows the flow of charge carriers within the layers of the semiconductor layer sequence 1 during operation of the semiconductor chip 100. First charge carriers, for example holes, are injected from the first layer 10 into the injection regions 2. As shown with the solid line arrows, the first charge carriers can directly enter the active layer 11 from the injection regions 2. In this case, the first charge carriers are distributed to all quantum well layers 111, so that first charge carriers are injected into each quantum well layer iii. The first charge carriers are thus preferably distributed to all quantum well layers 111, in particular uniformly distributed. Furthermore, second charge carriers, as shown with dashed line arrows, are also injected from the second layer 12 into the active layer 11 and the associated quantum well layers iii. The second charge carriers are, for example, electrons. Within the quantum well layers in, recombination of the electrons and holes can then occur, resulting in generation of electromagnetic radiation preferably in the UV region or in the visible region. Thereby, the injection regions 2 allow radiation generation to occur in all quantum well layers 111, so that the quantum efficiency of the semiconductor chip 100 is increased compared to semiconductor chips without injection regions.

The side surfaces 1a of the semiconductor layer sequence 1 are formed at least in places by the injection regions 2. In the injection regions 2, the second charge carriers can be particularly easily transported within the injection regions 2 along the stack direction S of the quantum well layers iii and uniformly distributed among the quantum well layers 111. Within the active region, the second charge carriers distribute in the lateral direction, along the main extension plane of the quantum well layers 111. By means of the injection regions 2, first charge carriers are kept away from the side surfaces 1a of the semiconductor layer sequence 1, thereby reducing surface effects on the side surfaces 1a and advantageously minimizing non-radiative recombination of charge carriers.

Figure 6B:
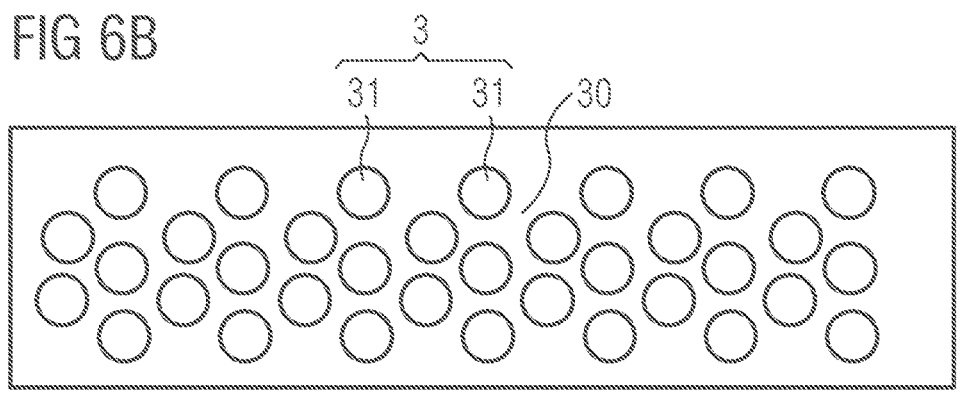
Figure 6C:
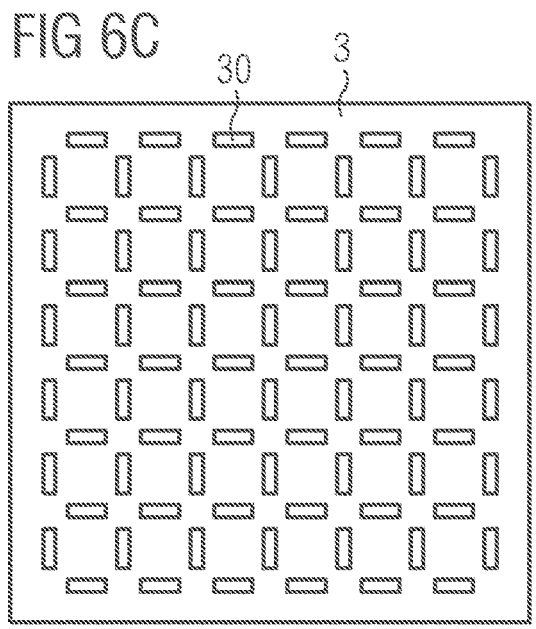

FIGS. 6A, 6B and 6C show different exemplary embodiments of masks 3 used in the method for producing an optoelectronic semiconductor chip 100 in method step B).

The mask 3 is applied to the side of the first layer 10 facing away from the active side before the method step B). The masks each comprise at least one opening 30 in which the semiconductor layer sequence 1 is exposed. By means of the mask 3 the dopant concentration is laterally defined and laterally limited. Thus, in a plan view, the geometry of the injection regions 2 or of the injection region 2 is specified. The semiconductor layer sequence 100 is singulated along the injection region 2 or injection regions 2 in method step C). Consequently, by means of the geometry of the injection regions 2 or the injection region 2, the geometry of the semiconductor chip(s) 100 formed during the singulation is specified.

The opening 30 may be formed as a grid as shown in FIG. 6A. For example, the opening 30 comprises the shape of a regular rectangular grid when viewed in a plan view of a main surface of the mask 3. Alternatively, the opening may comprise the shape of a regular hexagonal grid. Further, as shown in FIG. 6B, the mask 3 may comprise a plurality of circular regions 31 in which the mask 3 covers the semiconductor layer stack. A grid-shaped opening 30 surrounds the circular regions 31 of the mask 3. The circular regions 31 may be arranged, for example, at the nodes of an imaginary regular hexagonal grid. Further, the plurality of openings 30 may be formed to be rectangular, as shown in FIG. 6C, wherein the openings extend along the grid lines of an imaginary regular rectangular grid.

Figure 7:
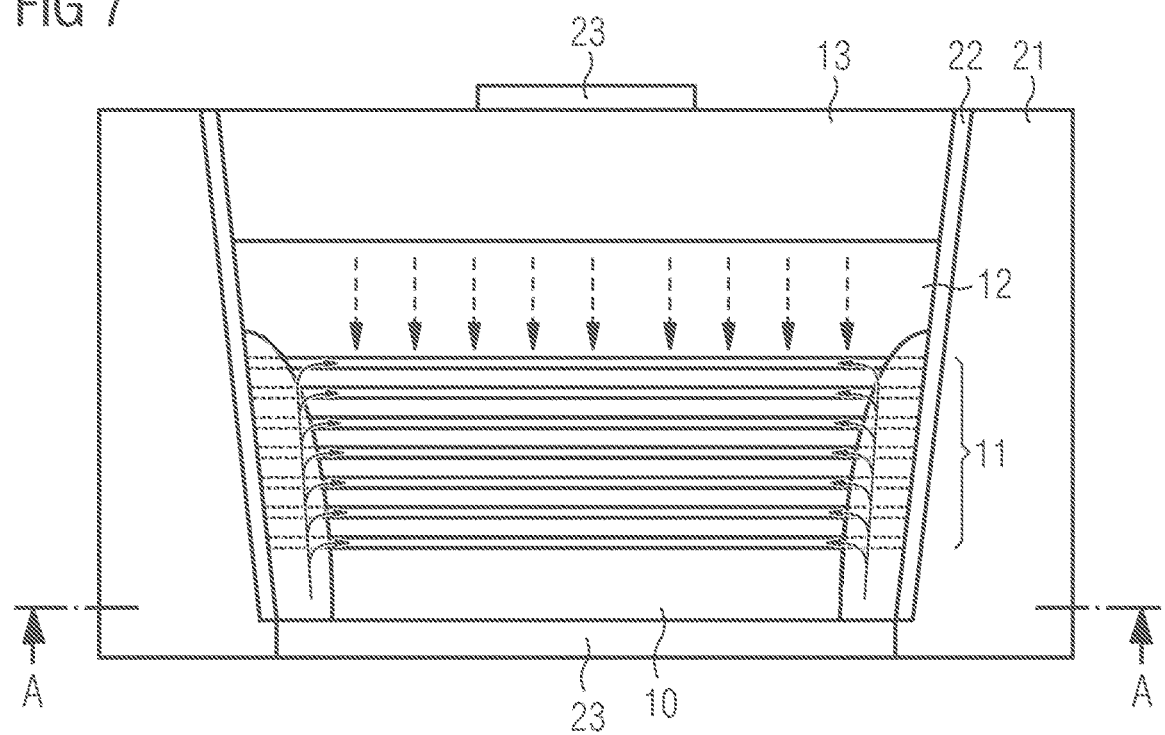

In FIG. 7, a semiconductor chip 100 is shown which is covered with a passivation 22 on the side surfaces is of the semiconductor layer sequence 1. On the side of the carrier 13 facing away from the second semiconductor layer 12 and on the side of the first layer 10 facing away from the active layer 11 a contact 23 is arranged in each case. By means of the contacts 23, the semiconductor chip can be electrically contacted. The contact 23 on the first semiconductor layer 10 is formed to be reflective for the radiation generated in the active layer 11 during operation. The contact 23 on the first semiconductor layer completely covers the side of the first semiconductor layer 10 facing away from the carrier 12. For example, the contact 23 on the carrier 13 is formed with a material that is transparent to electromagnetic radiation generated in the active layer 11. For example, the contact 23 on the carrier 13 is formed with indium tin oxide (ITO). The contact 23 on the carrier 13 only partially covers the carrier 13. Electromagnetic radiation generated in the active layer is emitted by the carrier 13 during operation. The semiconductor chip 100 is embedded in a potting body 21 which laterally surrounds, in particular completely surrounds, the semiconductor chip 100 and the contact 23 at the first semiconductor layer 10.

Figure 8:
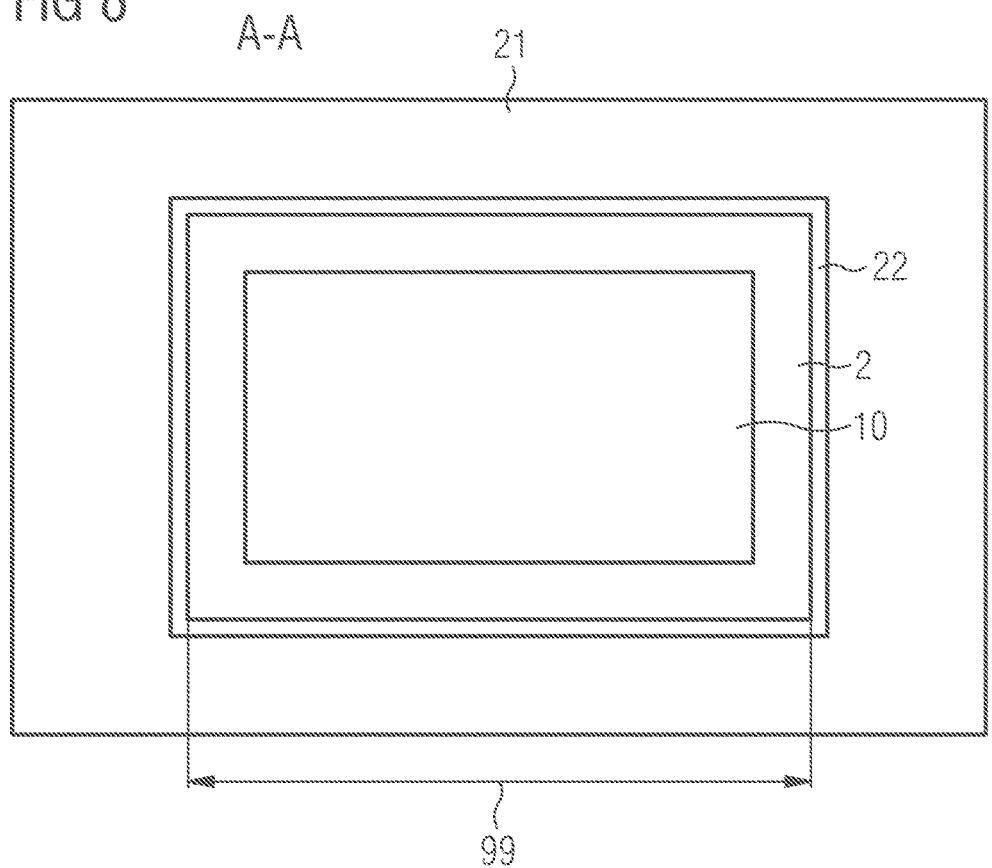

FIG. 8 shows a plan view of the sectional plane A-A of the encapsulated semiconductor chip 100 shown in FIG. 7. The semiconductor chip 100 comprises a rectangular cross-section and is completely surrounded in the lateral direction by the passivation 22 and the potting body 21. The semiconductor chip comprises a maximum edge length 99 of 20 µm, preferably 10 µm. All side surfaces is are formed at least in places by the injection region 2. All side surfaces of the semiconductor layer sequence 1 are formed with the material of the injection region 2. In particular, the injection region 2 completely surrounds the quantum well layers 111 along their main extension plane.

In FIG. 9, similar to FIG. 7, a sectional view of an exemplary embodiment of a semiconductor chip 100 is shown. The exemplary embodiments of FIG. 7 and FIG. 9 differ in that the contact 23 on the carrier 13 completely covers the carrier 23. The contact is formed with a material that is transparent to electromagnetic radiation generated in the active layer 11. For example, the contact is formed with indium tin oxide (ITO). Electromagnetic radiation generated in the active layer is emitted through the contact 23 on the carrier 13 during operation.

Further, the semiconductor chip 100 shown in FIG. 9 differs from the semiconductor chip 100 shown in FIG. 7 by the edge length 99. For example, the edge length 99 is at least 3 µm, preferably at least 20 µm. In order to ensure efficient current-supply of the quantum well layers iii, the semiconductor chip 100 comprises an additional injection region 2i, which is laterally surrounded by a continuous path of the active layer 11. Laterally, that is, parallel to a main extension direction of the semiconductor layer sequence 1, the additional injection region 2i is completely surrounded by a continuous and uninterrupted path of the active region 11 in which the doping level is opposite to or at least one order of magnitude smaller than in the region of the additional injection region 2i. The additional injection region 2i extends through the entire first layer 10 and the entire active layer 11 and partially projects, for example at least 50 nm, into the second layer 12. Thereby, the additional injection region 2i tapers in the direction away from the first layer 10. Here, the cross-sectional shape of the additional injection region 2i is dome-shaped. In particular, a semiconductor chip 100 may include a plurality of additional injection regions 2i.

The additional injection region 2i is manufactured by the same manufacturing method as the injection region 2 of the semiconductor chip 100. Thus, the additional injection region 2i comprises the same characteristics as the injection region 2 and vice versa.

For example, the additional injection region 2i within the active layer comprises a diameter or width, measured in the lateral direction, of at least 100 nm or at least 150 nm or at least 200 nm. Alternatively or additionally, the diameter or width of the additional injection region 2i is at most 500 nm or at most 250 nm or at most 200 nm. The diameter or width is thereby, for example, the maximum or mean diameter or the maximum or mean width.

FIG. 10 shows a top view of the sectional plane B-B of the encapsulated semiconductor chip 100 shown in FIG. 9. The semiconductor chip 100 comprises a rectangular cross-section and is completely surrounded by the passivation 22 and the potting body 21 in the lateral direction. The semiconductor chip 100 comprises a minimum edge length 99 of 20 µm. All side surfaces 1a of the semiconductor layer sequence 1 are formed at least in places with the material of the injection region 2. In particular, the injection region 2 completely surrounds the quantum well layers 111 along their main extension plane. In addition, the semiconductor chip 100 comprises an additional injection region 2i which is laterally surrounded by a continuous path of the active layer 11.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An optoelectronic semiconductor chip comprising:
   a semiconductor layer sequence with a first layer, a second layer and an active layer arranged between the first layer and the second layer, the semiconductor layer sequence having at least one injection region, wherein the first layer comprises a first conductivity type, wherein the second layer comprises a second conductivity type, wherein the semiconductor layer sequence comprises the first conductivity type within the entire injection region, wherein the injection region, starting from the first layer, at least partially penetrates the active layer, wherein side surfaces of the semiconductor layer sequence are formed at least in places by the injection region, and wherein the injection region is configured to inject charge carriers directly into the active layer.

2. The optoelectronic semiconductor chip according to claim 1, wherein the semiconductor layer sequence in the active layer comprises a lower dopant concentration than in the injection region.

3. The optoelectronic semiconductor chip according to claim 1, wherein the entire injection region comprises a dopant concentration of at least $10^{18}$ dopant atoms per $cm^3$, and wherein the dopant concentration within the active layer outside the injection region is at least one order of magnitude lower or opposite than in the injection region.

4. The optoelectronic semiconductor chip according to claim 1, wherein at least 50% of the side surfaces of the semiconductor layer sequence are formed by the injection region.

5. The optoelectronic semiconductor chip according to claim 1, wherein the side surfaces of the semiconductor layer sequence are formed by a plurality of non-contiguous injection regions.

6. An optoelectronic semiconductor chip comprising:

a semiconductor layer sequence with a first layer, a second layer and an active layer arranged between the first layer and the second layer, the semiconductor layer sequence having at least one injection region, wherein the first layer comprises a first conductivity type, wherein the second layer comprises a second conductivity type, wherein the semiconductor layer sequence comprises the first conductivity type within the entire injection region, wherein the injection region, starting from the first layer, at least partially penetrates the active layer, wherein side surfaces of the semiconductor layer sequence are formed at least in places by the injection region, wherein the injection region is configured to inject charge carriers directly into the active layer, wherein the active layer comprises a quantum well structure with at least one quantum well layer, wherein at least one barrier layer is arranged between each two adjacent quantum well layers, and wherein a band gap between a valence band and a conduction band in a region of the quantum well layer is smaller than in a region of the barrier layer and the injection region.

7. The optoelectronic semiconductor chip according to claim 1, wherein the injection region tapers from the first layer towards the second layer, wherein the injection region completely penetrates the active layer and projects into the second layer, and wherein the injection region projects at least 50 nm and at most 300 nm into the second layer.

8. The optoelectronic semiconductor chip according to claim 1, wherein the injection region tapers from the first layer towards the second layer, and wherein the injection region comprises a thickness between 50 nm and 5 µm inclusive, wherein the thickness of the injection region is measured perpendicular to the side surface from the side surface to the active layer.

9. The optoelectronic semiconductor chip according to claim 1, wherein, in the injection region, an indium concentration alternates along a stack direction of the semiconductor layer sequence.

10. The optoelectronic semiconductor chip according to claim 1, wherein the semiconductor chip comprises an extension of at most 20 µm along a main extension direction of the active layer.

11. The optoelectronic semiconductor chip according to claim 1, wherein the semiconductor chip comprises an extension of at least 3 µm along a main extension direction of the active layer, wherein the semiconductor chip comprises at least one additional injection region, and wherein the additional injection region is laterally surrounded by a continuous path of the active layer.

12. A method for producing an optoelectronic semiconductor chip, the method comprising:

providing a semiconductor layer sequence with a first layer of a first conductivity type, a second layer of a second conductivity type, and an active layer arranged between the first layer and the second layer, the active layer being capable of absorbing or emitting electromagnetic radiation;

forming a laterally defined and laterally limited injection region by doping the semiconductor layer sequence so that the semiconductor layer sequence comprises the same conductivity type as the first layer within the entire injection region, the injection region, starting from the first layer, at least partially penetrates the active layer, and the active layer is less or oppositely doped than in the injection region; and separating the semiconductor layer sequence to form at least one semiconductor chip by cutting through the semiconductor layer sequence along imaginary cutting lines, wherein the cutting lines run at least partially through the injection region, and wherein, after the separation, side surfaces of the semiconductor layer sequence are formed at least in places by the injection region.

13. The method according to claim 12, wherein the injection region forms a regular grid in plan view of the semiconductor layer sequence or a plurality of injection regions are arranged along grid lines of a regular grid.

14. The method according to claim 12, further comprising:

applying a mask to the side of the first layer facing away from the active layer, wherein the mask comprises at least one opening in which the semiconductor layer sequence is exposed; and performing doping by an ion implantation process in a region of the opening, wherein based on the mask the doping is laterally defined and laterally limited.

15. The optoelectronic semiconductor chip according to claim 6, wherein the barrier layer along a stack direction of a semiconductor layer stack comprises a thickness of at least 1 nm.

16. The optoelectronic semiconductor chip according to claim 6, wherein the semiconductor layer sequence in the active layer comprises a lower dopant concentration than in the injection region.

17. The optoelectronic semiconductor chip according to claim 6,
wherein the entire injection region comprises a dopant concentration of at least $10^{18}$ dopant atoms per $cm^3$, and
wherein the dopant concentration within the active layer outside the injection region is at least one order of magnitude lower or opposite than in the injection region.

18. The optoelectronic semiconductor chip according to claim 6,
wherein the injection region tapers from the first layer towards the second layer,
wherein the injection region completely penetrates the active layer and projects into the second layer, and
wherein the injection region projects at least 50 nm and at most 300 nm into the second layer.

19. The optoelectronic semiconductor chip according to claim 6, wherein, in the injection region, an indium concentration alternates along a stack direction of the semiconductor layer sequence.

* * * * *